United States Patent [19]

Nienhuis et al.

[11] 3,746,949

[45] July 17, 1973

[54] SEMICONDUCTOR DEVICE

[75] Inventors: Rijkent Jan Nienhuis; Theodorus Hubertus Josephus van den Hurk, both of Emmasingel, Eindhoven, Netherlands

[73] Assignee: U.S. Philips Corporation, New York, N.Y.

[22] Filed: Oct. 4, 1971

[21] Appl. No.: 186,077

[30] Foreign Application Priority Data

Oct. 10, 1970 Netherlands .......................... 7014890

[52] U.S. Cl. .......................... 317/235 R, 317/235 Z

[51] Int. Cl. .......................... H01l 5/00

[58] Field of Search .......................... 317/235, 40.13, 47

[56] References Cited

UNITED STATES PATENTS

| | | | |
|---|---|---|---|
| 3,582,726 | 6/1971 | Gilbert | 317/235 |
| 3,408,542 | 10/1968 | Dautzenberg | 317/235 |
| 3,611,072 | 10/1971 | Hamilton | 317/235 |

*Primary Examiner*—John W. Huckert

*Assistant Examiner*—E. Wojciechowicz

*Attorney*—Frank R. Trifari

[57] ABSTRACT

A semiconductor device having a transistor structure with strip-shaped emitter regions. The emitter regions as well as the intermediate regions of the base zone according to the invention comprise alternately narrower and wider parts, the emitter and base contact windows being provided only above the wider parts.

8 Claims, 11 Drawing Figures

Patented July 17, 1973 3,746,949

3 Sheets-Sheet 1

Figure 1:
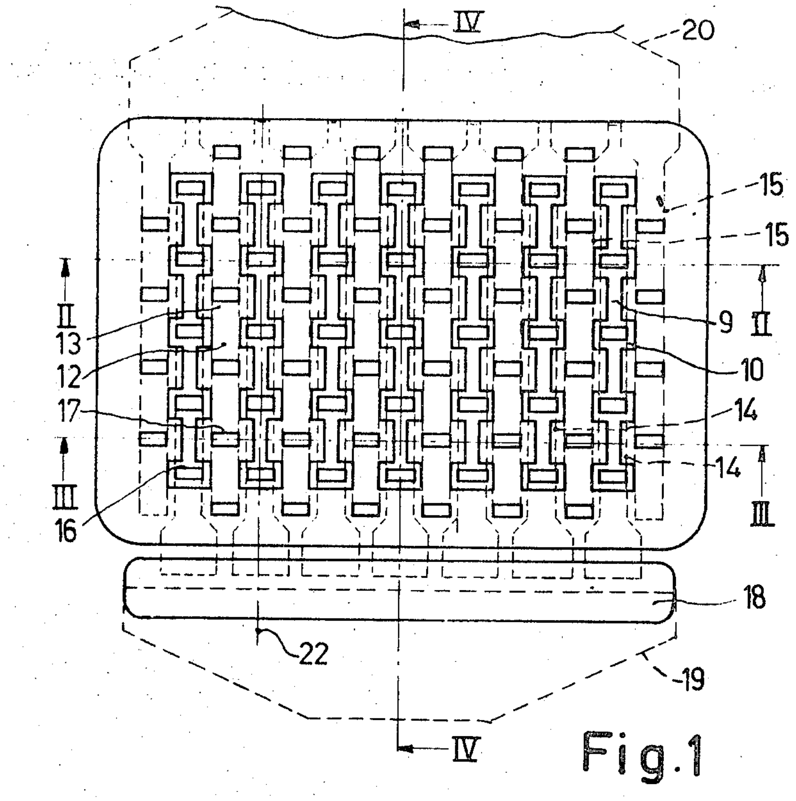

*INVENTOR.S*
RIJKENT JAN NIENHUIS
THEODORUS H. J. VAN DEN HURK
*BY*
Frank R. Trifari
AGENT

Patented July 17, 1973 3,746,949

3 Sheets-Sheet 2

*INVENTOR.S*
RIJKERT J. NIENHUIS
THEODORUS H. J. VAN DEN HURK
*BY*
AGENT

INVENTORS
PIETER J. [illegible]
THEODORUS H. J. VAN DER BURK
BY
AGENT

SEMICONDUCTOR DEVICE

The present invention relates to a semiconductor device comprising a semiconductor body having at least a collector zone of a first conductivity type, at least a base zone of the second conductivity type adjoining a substantially flat surface which is at least partly covered with an insulating layer, and an emitter zone of the first conductivity type which only adjoins the said surface and is further fully surrounded by the the base zone, the emitter zone comprising at least two strip-shaped mutually substantially parallel emitter regions.

Such devices are known, in particular in the form of high power high frequency transistors. The manufacture of transistors for comparatively high power and high frequency necessitates the solution of several problems, including the problem of obtaining a high emitter efficiency at comparatively high emitter currents and a distribution of the emitter current which is as uniform as possible over the emitter surface.

Attempts to finding the best possible solution to such problems have resulted in the origin of a variety of transistor types. The main problem is to obtain an emitter structure which, with a given emitter surface area, provides an emitter edge length which is as large as possible, since the injection of minority charge carriers occurs mainly along the edge of the emitter.

According to a first known structure, hereinafter termed interdigital structure, the emitter zone comprises strip-shaped regions of constant width and the emitter and the base contact layers are constructed as interdigitating usually comb-shaped patterns in which generally both the emitter zone and the base zone are contacted substantially throughout their surface by a metal layer via apertures in the insulating layer.

In a second known structure, hereinafter termed perforated emitter structure, a number of apertures are provided in a coherent emitter zone, via which apertures the base zone extends up to the surface. Both the emitter zone and the surface parts to which the base zone adjoins are contacted, via windows in the insulating layer, by means of strip-shaped interdigitating metal layers.

According to a third known structure, the so-called "overlay" structure, the emitter zone consists of a large number of partial zones which are separated from each other, are arranged in rows and are connected together in each row by a metal layer which adjoins the partial zones via windows in the insulating layer, metal strips being present between the metal layers and contacting the base zone.

In all these known structures a very large emitter edge length is obtained with a given overall emitter surface. For transistors which are to be operated at very high frequencies, the ratio between emitter edge length and emitter surface is made as large as possible, both to obtain an emitter efficiency which is as high as possible and to minimize the capacitances of the p-n junctions present.

In practice, however, this endeavor is restricted by the tolerances to be observed in mass manufacture. Actually, the partial projection of the contact windows in the insulating layer over the edge of the emitter and base regions should be prevented, since, a shortcircuit of the emitter-base junction can occur therefrom. When during the manufacture the conventional photoresist methods are used, the tolerance, in particular for the alignment of the masks for the emitter and base contact windows, is particularly narrow when the emitter and base regions have very small dimensions at least in one direction. Moreover, it will usually be preferred that the metal layers with which the base regions are contacted are not present above the emitter regions since the insulating layer above the emitter zone usually is considerably thinner than above the base zone and therefore the possibility of shortcircuit via holes in the thin insulating layer is large. In order to fulfill this requirement, a very narrow tolerance in aligning the mask for the metallization is also required in the case of emitter and base regions of dimensions which are very small at least in one direction.

As a result of the very stringent requirements, the reject percentage in mass producing the known transistor types, when using emitter and base regions having very small dimensions at least in one direction, will be relatively high.

One of the objects of the invention is to provide a semiconductor device having a new transistor structure and suitable for operation at comparatively high power and high frequency, in which the above-described difficulties occurring in known structures are avoided or are decreased at least considerably.

The invention is inter alia based on the recognition of the fact that when a new emitter-base structure is used in combination with a judicious provision of the emitter and base contact windows, the tolerance during the alignment of the various masks need be less narrow than in corresponding known structures, as a result of which a considerably better output in mass manufacture is obtained.

A semiconductor device of the type described in the preamble is therefore characterized according to the invention in that the strip-shaped emitter regions consist of alternately narrower and wider parts, at least two successive wider parts of a strip-shaped emitter region being present opposite to two successive wider parts of an adjacent strip-shaped emitter region, as a result of which a strip-shaped base region adjoining the semiconductor surface and also having alternately wider and narrower portions, is present between adjacent emitter regions, the strip-shaped emitter and base regions being electrically connected to respective metal layers present at least partly on the insulating layer via contact windows in the insulating layer, the contact windows on the strip-shaped emitter regions and on the strip-shaped base regions being present only above the wider parts of said regions.

As compared with the above described known devices, the device according to the invention has the important advantage that the places of the emitter and base contact windows are shifted relative to each other as a result of which a wider tolerance for the alignment of the relevant masks is obtained. Furthermore, the strip-shaped emitter and base regions outside the places where the contact windows are provided, i.e. the areas of the said narrower parts, can be made very narrow indeed without being limited by the alignment tolerance of the masks.

A further advantage of the device according to the invention is that the emitter edge length obtained is larger relative to the emitter surface than in known structures, for example the overlay structure and the perforated emitter structure. As compared with the perforated emitter structure, the device according to the invention has the additional advantage that the strip-shaped emitter regions are separated from each other by the strip-shaped base regions so that if emitter series resistors are connected in series with the strip-shaped emitter regions the current through each emitter region can be influenced quite independently by means of a similar series resistor so as to obtain a homogenous emitter current distribution, as a result of which, inter alia secondary, breakdown can be prevented. In the perforated emitter structure this is possible only partly since in such structure a current can flow between adjacent emitter series resistors via the emitter zone. If desirable, the base metallization in the device produced according to the present invention may be provided only outside the emitter zone in contrast with the perforated emitter structure.

An important advantage of the device of the present invention as compared with the said interdigital structure, is furthermore that, as can be calculated, with the same base surface and the same emitter edge length, the pitch of the strip-shaped emitter regions, i.e. the distance from center line to center line, is larger in the device according to the invention than in the interdigital structure. As a result of this, the metal strip which contacts an emitter region may be wider resulting in a smaller voltage drop across the metal strip.

Although strip-shaped emitter and base regions having narrower and wider parts bounded, for example, entirely or partly by curved lines or zig-zag lines may also be used, it will often be preferred in practice that at least the long sides facing each other of two adjacent strip-shaped emitter regions are crenel-shaped, i.e. are substantially entirely constituted by straight line sections which extend mutually substantially perpendicularly to each other and which divide the strip-shaped emitter regions into narrower parts having practically constant and mutually equal widths, and wider parts likewise having practically constant and mutually equal widths. The intermediate strip-shaped base region then has two crenel-shaped long sides. The corners of the crenel-shaped sides can be rounded off more or less.

The other long side of an emitter region may be constituted by a straight line, for example, when the emitter region is present at the end of a series of strip-shaped emitter regions. Advantageously, however, at least one and preferably all the strip-shaped emitter regions are symmetric relative to their center line. As a result of this a symmetrical, compact structure having a maximum emitter edge length is obtained.

The narrower parts and also the wider parts of a strip-shaped emitter or base region may have mutually different lengths in the direction of the relevant strip-shaped region. Preferably, however, the narrower parts and also the wider parts of the strip-shaped emitter and base regions, taken in the longitudinal direction of the regions, have the same length. In a strip-shaped region the length of the narrower parts may differ from that of the wider parts, while the narrower and the wider parts may also be of equal length, all this in such manner that an optimum emitter edge length, base resistance and emitter-base capacitance are obtained.

With a view to the generally low thickness of the insulating layer on the emitter zone, the mutual distance of the strip-shaped emitter region and the width of the metal layer which contacts the strip-shaped base region present between the emitter regions is preferably chosen to be so that the metal layers which contact the base zone do not extend above the emitter zone.

Although the strip-shaped emitter regions, if they are each fully surrounded by the base zone, can be operated as separate emitters of a so-called multi-emitter transistor, the emitter regions will in most of the cases be preferably connected together electrically. If desirable, series resistors may be incorporated in said connection. The connection can be produced entirely or partly by means of preferably metal conductors present outside the semiconductor material and can also be produced fully or partly by means of a semiconductor region of the first conductivity type belonging to the emitter zone.

Figure 2:
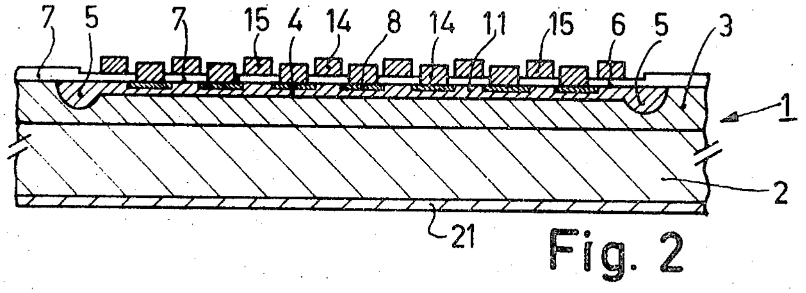
Figure 3:
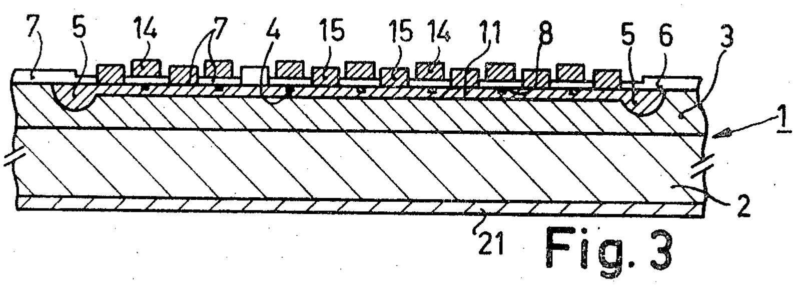
Figure 4:
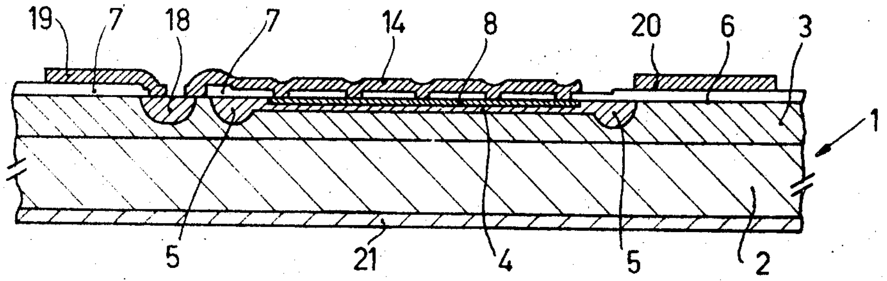
Figure 5:
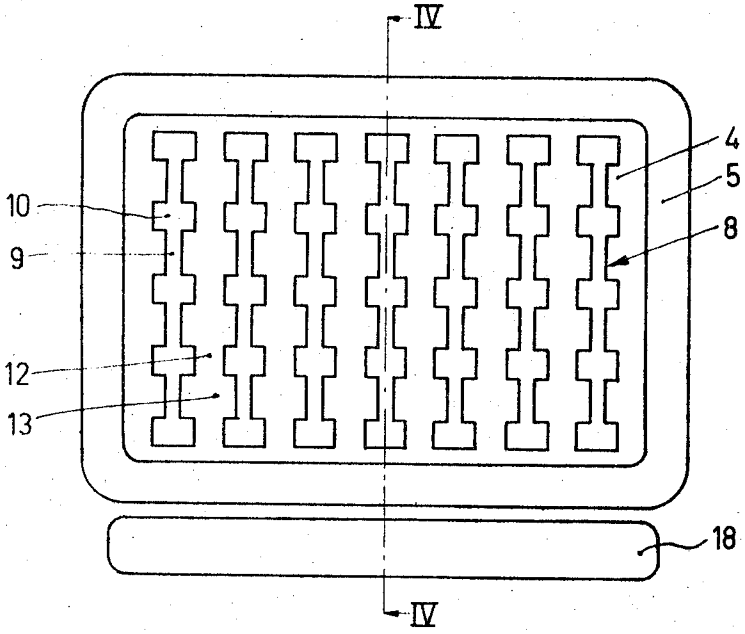
Figure 6:
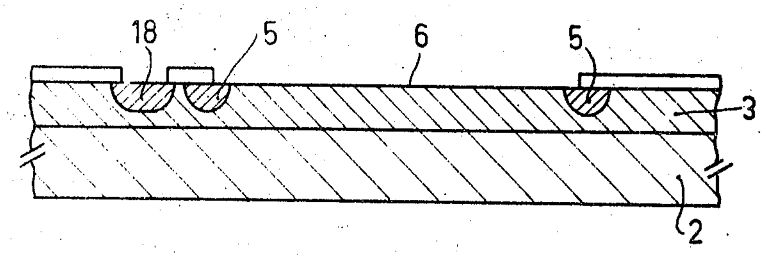
Figure 7:
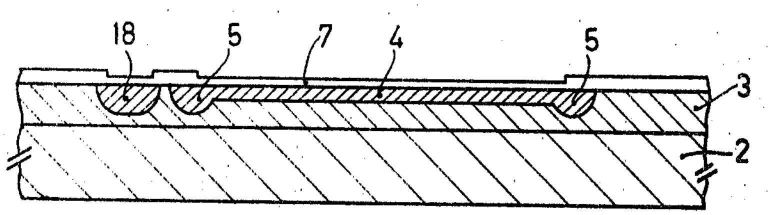
Figure 8:
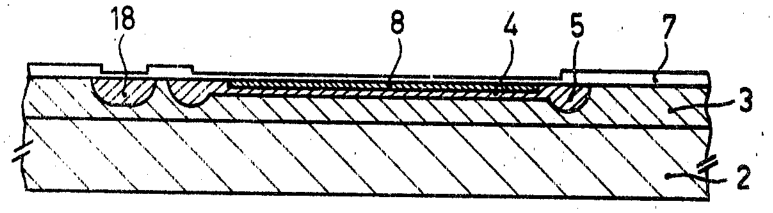
Figure 9A:
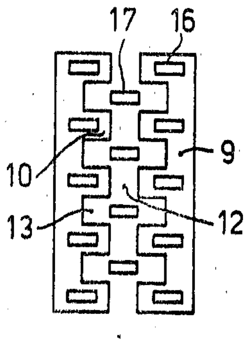
Figure 9B:
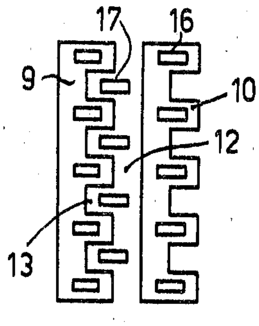
Figure 9C:
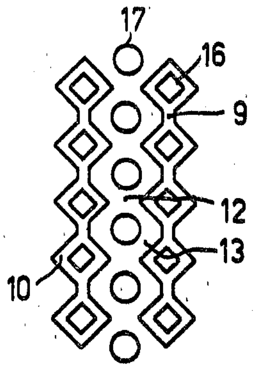

In order that the invention may be readily carried into effect, a few embodiments thereof will now be described in greater detail, by way of example, with reference to the accompanying drawings, in which FIG. 1 is a plan view of a device according to an embodiment of the invention, FIG. 2 is a diagrammatic cross-sectional view of the device taken on the line II—II of FIG. 1, FIG. 3 is a diagrammatic cross-sectional view of the device taken on the line III—III of FIG. 1, FIG. 4 is a diagrammatic cross-sectional view of the device taken on the line IV—IV of FIG. 1, FIG. 5 is a plan view of the device shown in FIG. 1 in which the limits of the diffused regions are shown, FIGS. 6 to 8 are diagrammatic cross-sectional views of the device shown in FIG. 1 in successive stages of manufacture and taken on the line IV—IV of FIG. 1 and FIGS. 9*a*, 9*b*, and 9*c* are a plan views of the emitter-base structure of a device according to other embodiments of the invention.

For clarity the Figures are diagrammatic and not drawn to scale; this applies in particular to the dimensions in the direction of thickness. Corresponding parts are generally referred to by the same reference numerals.

In a first embodiment (FIGS. 1 and 2), the device has a semiconductor body 1 of silicon consisting of an n-type substrate 2 having, for example, a thickness of 100 microns and a resistivity 0.07 0hm.cm, and an epitaxial n-type layer 3, having, for example, a resistivity of 0.9 0hm.cm, and a thickness of 14 microns, grown on the body. This semiconductor body 1 comprises a transistor having an n-type collector zone constituted by the layer 3; a p-type base zone (4, 5) which is diffused in the layer 3 and adjoins a substantially flat surface 6 which is covered by an insulating layer 7 of silicon oxide, and an n-type emitter zone which comprises (e.g.) seven a number strip-shaped emitter regions 8 (see FIGS. 2, 3, 4) which mutually are substantially parallel and which are surrounded by the base zone (4, 5) and adjoin the surface 6.

According to the invention, the strip-shaped emitter regions 8 consist of alternately narrower parts 9 and wider parts 10 (FIG. 1), at least two, and in this example all, successive wider parts 10 of a strip-shaped emitter region 8 being present opposite to two successive wider parts 10 of an adjacent strip-shaped emitter region. As a result of this, a strip-shaped base region 11 (FIGS. 2 and 3) adjoining the surface 6 and also having alternately narrower parts 12 and wider parts 13 (FIG. 1) are formed between each pair of adjacent emitter regions 8. The emitter regions 8 and the base regions 11 are electrically connected to aluminium layers 14 and 15 respectively, that are partly present on the oxide layer 7 (shown FIG. 1 bounded by broken lines) via contact windows 16, 17, respectively, in the oxide layer 7, the contact windows 16 on the strip-shaped emitter regions 8 being present only above the wider parts 10 of the emitter regions 8 and the contact windows 17 on the strip-shaped base regions 11 being present only above the wider parts 13 of the base regions 11.

In this device 1 the p-type base zone 11 consists of two regions of different doping and depth of penetration, a central region 4 in which the emitter zones 8 are provided, and an annular edge zone 5 of higher doping and greater depth of penetration than the central region 4 to obtain a sufficiently high effective collector-base breakdown voltage. Simultaneously with the diffusion of the base edge 5, there is diffused (FIGS. 1 and 4) a resistance region 18 which is adjoined on one side by the emitter contact layers 14 and on the other side by an aluminum layer 19. As a result of this an emitter series resistor, formed by the part of the resistance region 18 present between the layer 19 and the relevant contact layer 14, is present between each emitter contact layer 14 and the aluminum layer 19; the strip-shaped emitter regions 8 are all connected together electrically via the layers 14 and 19 and the region 18. All the base contact layers 15 are connected to the aluminum layer 20. Emitter and base connection conductors (not shown) are provided in normal manner on the layers 19 and 20, while a contact layer 21 (FIG. 4) which serves as a collector contact and is secured to the base plate of an envelope, is provided on the substrate region 2.

As shown in the figures, the base contact layers 15 do not extend above the emitter regions 8 so that short-circuit via the thin parts of the oxide layer 7 present above the emitter regions is prevented. The long sides of the emitter regions 8 are all crenel-shaped and consist of line sections which mutually are substantially perpendicular, so that both the narrower and the wider parts of the emitter and base strips 8 and 11, respectively, all have a constant and mutually equal width. All the strip-shaped emitter regions 8 are symmetric relative to their center line (22 in FIG. 1), while narrower parts (9, 12) and also the wider parts (10, 13) of the emitter and base regions 8 and 11, respectively taken in the longitudinal direction of these regions, have the same length.

The device described may be manufactured, for example, as follows. Starting material is an n-type silicon plate having, e.g., a resistivity of 0.07 0hm.cm, and a thickness of 200 microns. A surface of the plate is made free from crystal defects as much as possible by polishing and etching, after which an epitaxial layer 3 of n-type silicon, with, e.g., resistivity 0.9 0hm.cm; and thickness 14 microns, is deposited on the surface according to conventionally used methods. Several devices according to the invention can be manufactured simultaneously on the silicon plate thus obtained.

The further manufacture will be described with reference to the steps illustrated in FIGS. 5 through 8 in FIG. 5 and the cross-sectional views shown in FIGS. 6, 7 and 8, taken on the line IV—IV. First an oxide layer 7 is provided on the layer 3 by thermal oxidation e.g., for 90 minutes at 1,100° C in moist oxygen, in which oxide layer 7 windows are etched in the usual manner by photolithographic etching methods, through which windows boron is then diffused to form the resistance region 18 and the annular base edge zone 5. The sheet resistance of the regions 5 and 18 is for example 6.3 0hms per square. In the resulting oxide layer apertures are etched for performing a further base diffusion, the structure shown in FIG. 6 being obtained. An aperture is also made in the oxide above the region 18 so as to obtain, after the subsequent base diffusion, an oxide layer of equal thickness above the base zone and above the region 18. The base contact windows and the aperture to be made in the oxide layer for contacting the region 18 can then be etched simultaneously without any objection and without any danger of "underetching" near the base contact holes.

After the base diffusion, in which boron is diffused with such a surface concentration that the sheet resistance is for example 135 0hm per square, the structure shown in FIG. 7 is obtained. The depth of penetration of the regions 5 and 18 is for example approximately 4 microns and the depth of penetration of the part 4 of the base zone is for example 1.7 microns.

After etching emitter diffusion windows in the oxide layer, the strip-shaped emitter regions 8 are provided by means of a phosphorus diffusion with a sheet resistance of 9 0hm per square and a depth of for example penetration of 1 micron. The structure shown in plan view in FIG. 5 and in a cross-ectional view taken on the line IV—IV of FIG. 1 shown in FIG. 8 is obtained. The sharp corners in the crenel-shaped edges shown diagrammatically in FIG. 5 will actually be slightly rounded as a result of lateral diffusion.

The base and emitter contact windows and the contact windows required for contacting the region 18 are then provided by means of a single mask. The tolerance for the alignment of the mask relative to the formed diffusion pattern is considerably wider than, for example, in an interdigital structure in which the strip-shaped emitter regions have the same width as that of the narrower parts 9 of the strip-shaped emitter regions 8.

After etching the emitter and base contact windows, the aluminum layers 14, 15, 19 and 20 are vapour-deposited in the conventional manner and the lower side of the substrate 2 is etched until the overall silicon thickness is approximately 150 microns, after which the device is assembled according to known methods and provided in a suitable envelope.

The width of the metal layers 14 may be larger and as a result of this a voltage drop across the metal layers may be smaller than in a comparable interdigital structure having strip-shaped emitter regions of the same width everywhere. It can actually be proven that, with equal surface of the base zone and with equal emitter edge length, the distance in the device according to the invention from center line to center line between the strip-shaped emitter regions is larger.

In addition to the shape used in this example of the strip-shaped emitter regions, quite different shapes for such regions and/or for the contact windows may also be used, if desirable. A few alternative possibilities are shown by way of example in FIG. 9 in which the reference numerals correspond to those of the example shown in FIGS. 1 to 8.

It is to be noted that several base zones can be provided on the same silicon plate in which, in order to increase the power to be supplied, several transistor structures of the type described having a common collector can be manufactured on the same crystal plate, the base zones and the emitter zones also being connected together. In addition, the transistor together with other semiconductor circuit elements may form part of a monolithic integrated circuit.

After the above description it will be obvious that the invention is not restricted to the examples described, but that many variations are possible to those skilled in the art without departing from the scope of this invention. For example, in addition to transistors, the invention may also be used with other devices which contain a transistor structure, for example thyristors or other multilayer structures. Other semiconductor materials, other insulating layers, for example, silicon nitride or aluminium oxide or combinations thereof, and other metal layers may alternatively be used, while the emitter series resistors may also be omitted or be constructed differently, for example as metal layers.

What is claimed is:

1. A semiconductor device comprising a semiconductor body having a substantially flat surface and including a collector zone of a first conductivity type, a base zone of a second conductivity type adjoining said flat surface, an emitter zone of said first conductivity type which adjoins said surface and is fully surrounded within said body by said base zone, an insulating layer covering at least a portion of said surface and containing contact windows, and metal layers at least partly disposed on said insulating layer for making electrical contact to said emitter and base zones, said emitter zone comprising at least two strip-shaped substantially parallel emitter regions each comprising alternately narrower and wider parts measured parallel to said flat surface, at least two successive ones of said wider parts of one of said strip-shaped emitter regions being located opposite to two successive wider parts of an adjacent strip-shaped emitter region, a strip-shaped base region disposed between said adjacent emitter regions and adjoining said flat surface, said base region comprising a part of said base zone and having alternately narrower and wider parts measured parallel to said flat surface and defined by and extending between the oppositely located successive wider and narrower emitter region parts respectively, said strip-shaped emitter and base regions being electrically connected via said contact windows in said insulating layer to said respective metal layers, said contact windows over said strip-shaped emitter regions and over said strip-shaped base regions being present only above respective said wider parts of said regions.

2. A semiconductor device as recited in claim 1, wherein at least two adjacent ones of said strip-shaped emitter regions comprise long sides facing each other and at least said long sides are crenel-shaped.

3. A semiconductor device as recited in claim 1, wherein at least one of said strip-shaped emitter regions is symmetric about the center line thereof.

4. A semiconductor device as recited in claim 1, wherein respective said narrower parts and said wider parts of said strip-shaped emitter and base regions have substantially the same length along the longitudinal directions of said regions.

5. A semiconductor device as recited in claim 1, wherein said metal layers contacting said base regions extend above only said base regions and said metal layers contacting said emitter regions extend above only said emitter zones.

6. A semiconductor device as recited in claim 1, wherein at least one of said strip-shaped emitter regions is provided with an emitter series resistance.

7. A semiconductor device as recited in claim 1, wherein said strip-shaped emitter regions are electrically interconnected.

8. A semiconductor device as recited in claim 1, wherein respective said narrower parts of said emitter and base regions are disposed at the respective central longitudinal axes of said regions.

* * * * *